(12) United States Patent
Park et al.

(10) Patent No.: US 9,496,441 B2
(45) Date of Patent: Nov. 15, 2016

(54) SOLAR CELL MODULE SUPPORT ASSEMBLY

(75) Inventors: Doo Yeol Park, Incheon (KR); Gi Ju Park, Gyeonggi-do (KR)

(73) Assignee: RAON TECH CO., LTD., Seoul (KR)

( * ) Notice: Subject to any disclaimer, the term of this patent is extended or adjusted under 35 U.S.C. 154(b) by 348 days.

(21) Appl. No.: 14/123,098

(22) PCT Filed: Jul. 11, 2011

(86) PCT No.: PCT/KR2011/005051
§ 371 (c)(1),
(2), (4) Date: Nov. 28, 2013

(87) PCT Pub. No.: WO2012/165697
PCT Pub. Date: Dec. 6, 2012

(65) Prior Publication Data
US 2014/0102514 A1    Apr. 17, 2014

(30) Foreign Application Priority Data

Jun. 1, 2011   (KR) .................. 10-2011-0052789
Jun. 1, 2011   (KR) .................. 10-2011-0052790

(51) Int. Cl.
*F24J 2/52*    (2006.01)
*H01L 31/05*   (2014.01)
*H01L 31/052*  (2014.01)
(Continued)

(52) U.S. Cl.
CPC .......... *H01L 31/0522* (2013.01); *F24J 2/5209* (2013.01); *F24J 2/5232* (2013.01); *F24J 2/542* (2013.01); *H01L 31/054* (2014.12); *H02S 20/00* (2013.01); *F24J 2002/5462* (2013.01);
(Continued)

(58) Field of Classification Search
CPC ................ F24J 2002/5472; F24J 2002/5444; H02S 20/30; H02S 20/32
See application file for complete search history.

(56) References Cited

U.S. PATENT DOCUMENTS

| 4,172,739 A * | 10/1979 | Tassen ................... F24J 2/542 136/246 |
| 4,368,962 A * | 1/1983 | Hultberg ................. F24J 2/38 126/605 |
| 2011/0174295 A1 * | 7/2011 | Clavijo Lumbreras .. F24J 2/542 126/605 |

FOREIGN PATENT DOCUMENTS

| DE | 102005042478 A1 | 3/2007 | |
| ES | WO 2010034851 A1 * | 4/2010 | ............. F24J 2/5209 |

(Continued)

OTHER PUBLICATIONS

Machine translation of DE102005042478A1.*
(Continued)

*Primary Examiner* — Eric R Smith
(74) *Attorney, Agent, or Firm* — Park, Kim & Suh, LLC

(57) ABSTRACT

Disclosed herein is a solar cell module support assembly including a solar cell module and a frame supporting the solar cell module, a drive motor and a power transmission unit transmitting power of the drive motor so as to support frame and change disposition angle and disposition direction of the frame, a motion conversion unit to convert rotating motion of the power transmission unit into rotating motion and vertical motion of the frame, first connection support units connecting upper and lower portions of the rear surface of the frame, and second connection support units connecting the first connection support units to the motion conversion unit.

8 Claims, 16 Drawing Sheets

(51) Int. Cl.
*H01L 31/042* (2014.01)
*H01L 31/054* (2014.01)
*F24J 2/54* (2006.01)

(52) U.S. Cl.
CPC ......... *F24J2002/5472* (2013.01); *Y02E 10/47* (2013.01); *Y02E 10/50* (2013.01)

(56) References Cited

FOREIGN PATENT DOCUMENTS

| IL | WO 2011073978 A2 * | 6/2011 | ................ F24J 2/10 |
|---|---|---|---|
| JP | 2005-039148 A | 2/2005 | |
| JP | 2005-268671 A | 9/2005 | |
| JP | 2008-066632 A | 3/2008 | |
| KR | 10-0814343 B1 | 3/2008 | |
| KR | 10-0941459 B1 | 2/2010 | |
| KR | 10-0961982 B1 | 6/2010 | |
| KR | 10-1017083 B1 | 2/2011 | |
| KR | 101031286 B1 * | 4/2011 | |
| WO | 2007/025618 A1 | 3/2007 | |

OTHER PUBLICATIONS

Machine translation of KR10-1031286B1.*
International Search Report in International Application No. PCT/KR2011/005051, dated May 23, 2012.

* cited by examiner

SOLAR CELL MODULE SUPPORT ASSEMBLY

CROSS-REFERENCE TO RELATED APPLICATIONS

This application is the National Stage filing under 35 U.S.C. 371 of International Application No. PCT/KR2011/005051, filed on Jul. 11, 2011, which claims the benefit of Korean Patent Application No. 10-2011-0052789, filed on Jun. 1, 2011 and Korean Patent Application No. 10-2011-0052790, filed on Jun. 1, 2011, the contents of which are all hereby incorporated by reference herein in their entirety.

TECHNICAL FIELD

The present invention relates to a solar cell module support assembly, and more particularly, to a solar cell module support assembly which achieves balanced support of a solar cell module and changes disposition angle and direction of the solar cell module according to altitude and direction of the sun.

BACKGROUND ART

Recently, as fossil fuels, such as oil and coal, are being exhausted, development of alternative energy is underway. Particularly, development of energy resources using solar energy is vigorously carried out.

Electricity generation techniques to generate electricity using solar energy are divided into electricity generation using heat of the sun which generates electricity by driving a heat engine using heat of the sun, and electricity generation using light of the sun which generates electricity from a solar cell using light of the sun.

Here, the solar cell used in electricity generation using light of the sun includes a semiconductor compound element which converts light of the sun directly into electricity.

The solar cell used in electricity generation using light of the sun generally uses silicon and a composite material. Concretely, the solar cell uses junction between a P-type semiconductor and an N-type semiconductor, and uses a photoelectric effect which produces electricity from light of the sun.

Most solar cells include large-area P-N junction diodes, and electromotive force generated from both electrode ends of the P-N junction diodes is connected to external circuits.

The minimum unit of these solar cells is referred to as a cell, and the cell is scarcely used as it is.

While substantially necessary voltage is several V to several tens of V or several hundred V, voltage emitted from one cell is excessively small, i.e., about 0.5V. Therefore, multiple unit cells are connected in series or in parallel to produce a necessary unit capacity.

Further, if the solar cell is used outdoors, the solar cell is placed under various severe conditions. In order to protect the solar cell, in which multiple unit cells are connected to produce a necessary unit capacity, from the severe conditions, a solar cell module in which plural cells are packaged is used.

However, a large number of solar cell modules are used to obtain designated electricity, and a place in which the solar cell modules are installed is restricted. That is, the solar cell modules may be installed on the top of a building or an outdoor facility without difficulty, but when the solar cell modules are installed on an apartment building which occupies a considerable number of residences, it is difficult to install the solar cell modules in a separate unit household.

In the conventional solar cell module, supporters to support main frames and the solar cell module and support rods to support the main frames relative to the ground, serving as a support structure to support the solar cell module, may be mostly bonded by welding. Therefore, when welding of the support structure has been completed after setting of the position of the support structure, it is difficult to adjust the disposition state of the support structure later.

Particularly, in the case of a fixed support structure to support a large number of solar cell modules, the disposition angle of the support structure is fixed, and thus adjustment of the disposition angle of the solar cell modules based on change of altitude of the sun according to the 24 divisions of the year in the lunar calendar is limited and the fixed support structure has drawbacks, such as low light collection efficiency and low electricity production efficiency.

That is, in Korea, based on the meridian altitudes of the sun at the respective seasons in consideration of the latitude (38°) of Korea, the meridian altitude of the sun is about 52° at the vernal equinox or autumnal equinox, is about 75.5° at the summer solstice, and is about 28.5° at the winter solstice.

However, the conventional solar cell module is installed with a fixed inclination so as to face the due south, and thus has a high deviation of an electricity production amount according to season.

Further, if the solar cell module is rotatably supported by a support assembly so as to achieve change of the direction of the solar cell module, a support point is mainly formed at the center of the solar cell module and thus the solar cell module is not effectively supported when the solar cell module is rotated, thereby causing disorder in support balance.

DISCLOSURE

Technical Problem

Accordingly, the present invention is directed to a solar cell module support assembly.

An object of the present invention is to provide a solar cell module support assembly which changes the disposition angle and disposition direction of a solar cell module corresponding to change of altitude and direction of the sun.

Another object of the present invention is to provide a solar cell module support assembly which supports not only a central portion of a frame supporting a solar cell module but also plural other portions of the frame to more stably maintain the support state of the solar cell module.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

Technical Solution

To achieve this object and other advantages and in accordance with the purpose of the invention, as embodied and broadly described herein, a solar cell module support assembly includes a motion conversion unit including a support unit connected to a connection shaft provided on rotating housings, rotated according to rotation of the rotating housings, and having a uniformly maintained height, a lift arm connected to a support unit and provided with a lower end inserted into a cam groove such that the height of the lift arm is vertically adjustable according to rotation of the support unit, and a support plate disposed at the upper end of the support unit and the upper end of the lift arm such that disposition angle and disposition direction of a support plate are changed according to change of a relative height difference between the support unit and the lift arm and change of a disposition direction of the support unit and the lift arm during operation of a drive motor and a frame supporting a solar cell module is seated on the upper surface of the support plate.

It is to be understood that both the foregoing general description and the following detailed description of the present invention are exemplary and explanatory and are intended to provide further explanation of the invention as claimed.

Advantageous Effects

As apparent from the above description, in a solar cell module support assembly in accordance with the present invention, a frame supporting a solar cell module is supported by first connection support units and second connection support units, thus preventing damage to the solar cell module due to external force, such as wind.

Particularly, since a support plate supports the central portion of the frame, the first connection support units support several portions of the frame and the support plate and the first connection support units are connected to a support unit, if disposition direction and disposition angle of the solar cell module and the frame are changed, rotary force may be stably distributed throughout the solar cell module and the fame.

Further, power of a drive motor is used to change the disposition direction and disposition angle of the solar cell module through a power transmission unit including a plurality of gears, and thus the drive motor having relatively small output may be used to change the disposition state of the solar cell module having a large area.

Moreover, by applying change degrees of altitude and azimuth of the sun to a cam groove provided on a casing, the change of the disposition direction and disposition angle of the solar cell module may correspond to altitude and azimuth of the sun.

Therefore, light collection efficiency and electricity production efficiency of the solar cell module may be maximized.

The solar cell module support assembly in accordance with the present invention allows the drive motor having relatively small output to be used to change the disposition direction and disposition angle of the solar cell module through the power transmission unit including the plurality of gears, and thus maximizes light collection efficiency and electricity production efficiency of the solar cell module, thereby being applied to solar cells having various structures and shapes.

DESCRIPTION OF DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

BEST MODE

Reference will now be made in detail to the preferred embodiments of the present invention, examples of which are illustrated in the accompanying drawings. Wherever possible, the same reference numbers will be used throughout the drawings to refer to the same or like parts.

Figure 1:
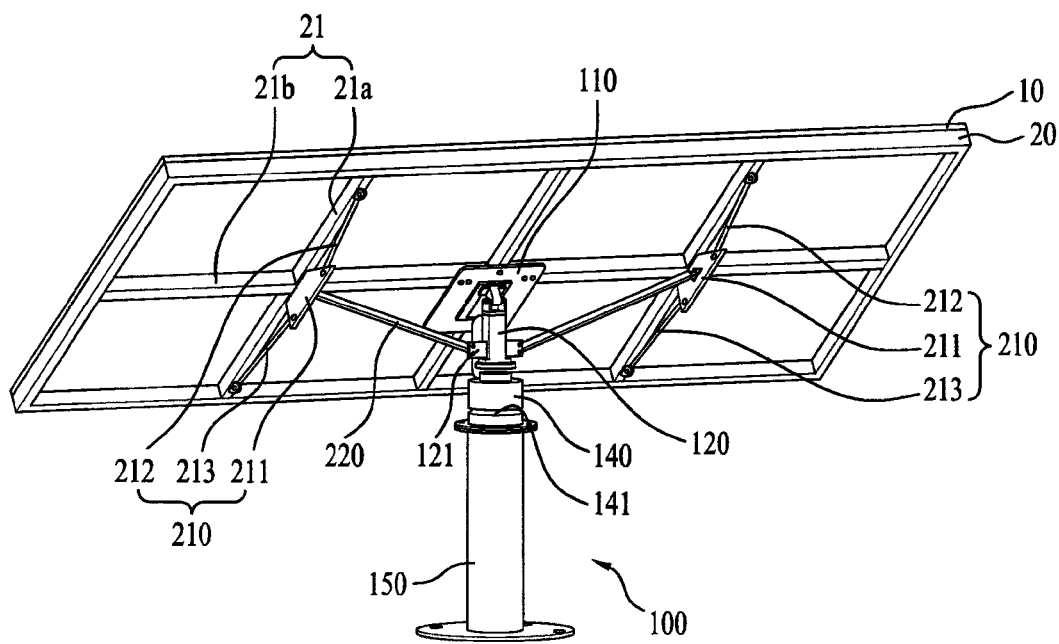
FIG. 1 is a rear perspective view illustrating a solar cell module and a solar cell module support assembly in accordance with the present invention.

As shown in FIG. 1, a solar cell module support assembly 100 in accordance with the present invention includes a frame 20 supporting the lower surface of a plate-shaped solar cell module 10, a support plate 110 supporting the frame 20, a support unit 120 and a lift arm 130 supporting the support plate 110, a casing 140 supporting the support unit 120 and the lift arm 130 and provided with a cam groove 141 formed on the outer circumferential surface thereof, and a rod-shaped supporter 150 provided under the casing 140 and accommodating a drive motor (not shown) therein.

First connection support units 210 connecting the upper and lower portions of the frame 20 and second connection support units 220 connecting the first connection support units 210 to the support unit 120 are provided at both sides of the support plate 110.

The first connection support units 210 and the second connection support units 220 is preferably disposed to have an approximately H shape.

The frame 20 is divided into a plurality of planes by a plurality of divisional walls, and the plurality of divisional walls includes vertical divisional walls 21a and horizontal divisional walls 21b.

Each of the first connection support units 210 includes a bracket 211 provided on the vertical divisional wall 21*a*, an upper connection rod 212 connecting the bracket 211 to the upper portion of the vertical divisional wall 21*a*, and a lower connection rod 213 connecting the bracket 211 to the lower portion of the vertical divisional wall 21*a*.

Preferably, the first connection support units 210 are arranged at both sides of the rear surface of the frame 20 such that the first connection support units 210 are separated from each other.

Preferably, each of the second connection support units 220 is provided in a rod type connecting the bracket 211 to each of extension pieces 121 provided at both sides of the support unit 120.

The above-described first and second connection support units 210 and 220 prevent the disposition state of the solar cell module 10 and the frame 20 from being changed or modified.

Figure 2:
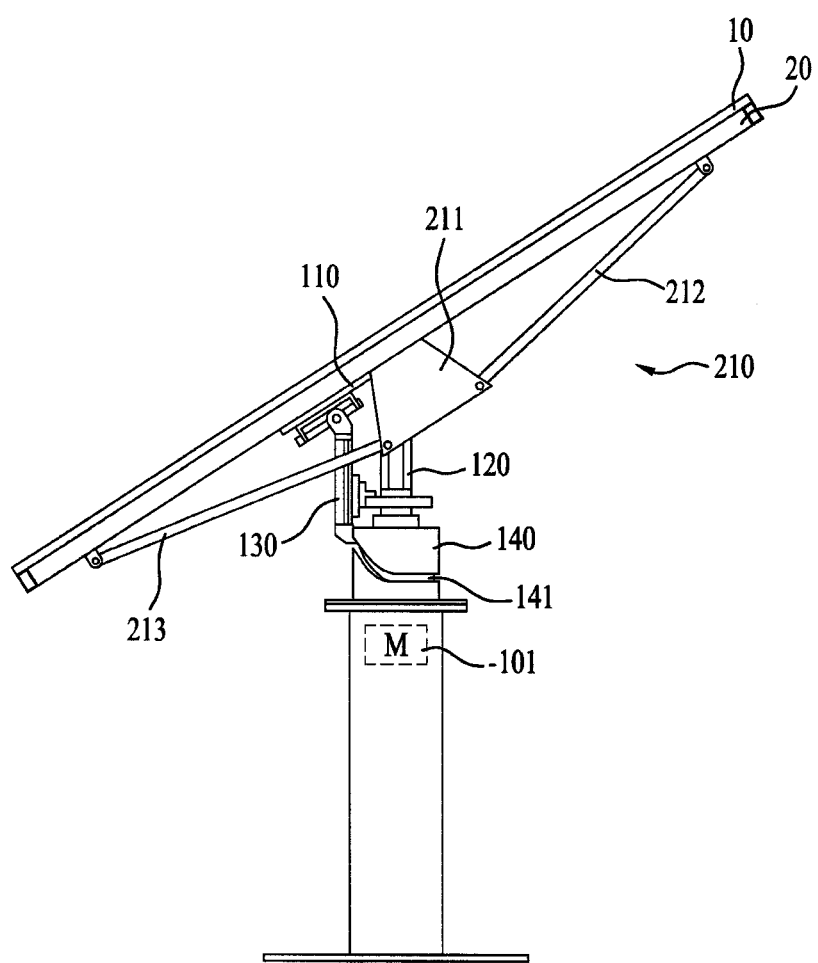
FIG. 2 is a side view illustrating the solar cell module and the solar cell module support assembly in accordance with the present invention.

As shown in FIG. 2, the solar cell module 10 and the frame 20 are arranged at a designated inclination relative to the ground.

The support unit 120 and the lift arm 130 are respectively connected to the lower surface of the support plate 110 disposed on the lower surface of the frame 20.

Preferably, the height of the support unit 120 is regularly maintained and the height of the lift arm 130 is vertically adjustable, thereby adjusting the disposition angle of the frame 20 and the solar cell module 10.

The support unit 120 is rotated by the drive motor 101 and a power transmission unit 300 (with reference to FIG. 5) connected to the drive motor 101, and thus may change the disposition direction of the solar cell module 10 and the frame 20.

Since the support unit 120 is connected to the lift arm 130, when the support unit 120 is rotated, the lift arm 120 is also rotated.

Since the casing 140 is not rotated, the support unit 120 and the lift arm 130 are rotated relative to the casing 140.

However, since the casing 140 is provided with the cam groove 141 and the lower end of the lift arm 130 is engaged with the cam groove 141, the height of the lift arm 130 is changed if the lift arm 130 moves along the cam groove 141.

Accordingly, the disposition angle and disposition direction of the frame 20 and the solar cell module 10 may be changed.

The cam groove 141 is formed along the outer circumferential surface of the casing 140, and has a closed loop shape provided with a high part and a lower part so as to change the height of the lift arm 130.

Here, the bracket 211 is preferably provided in a trapezoidal shape and ends of the upper connection rod 212 and the lower connection rod 213 are preferably connected to portions of the bracket 211 adjacent to corners of the bracket 211.

Figure 3:
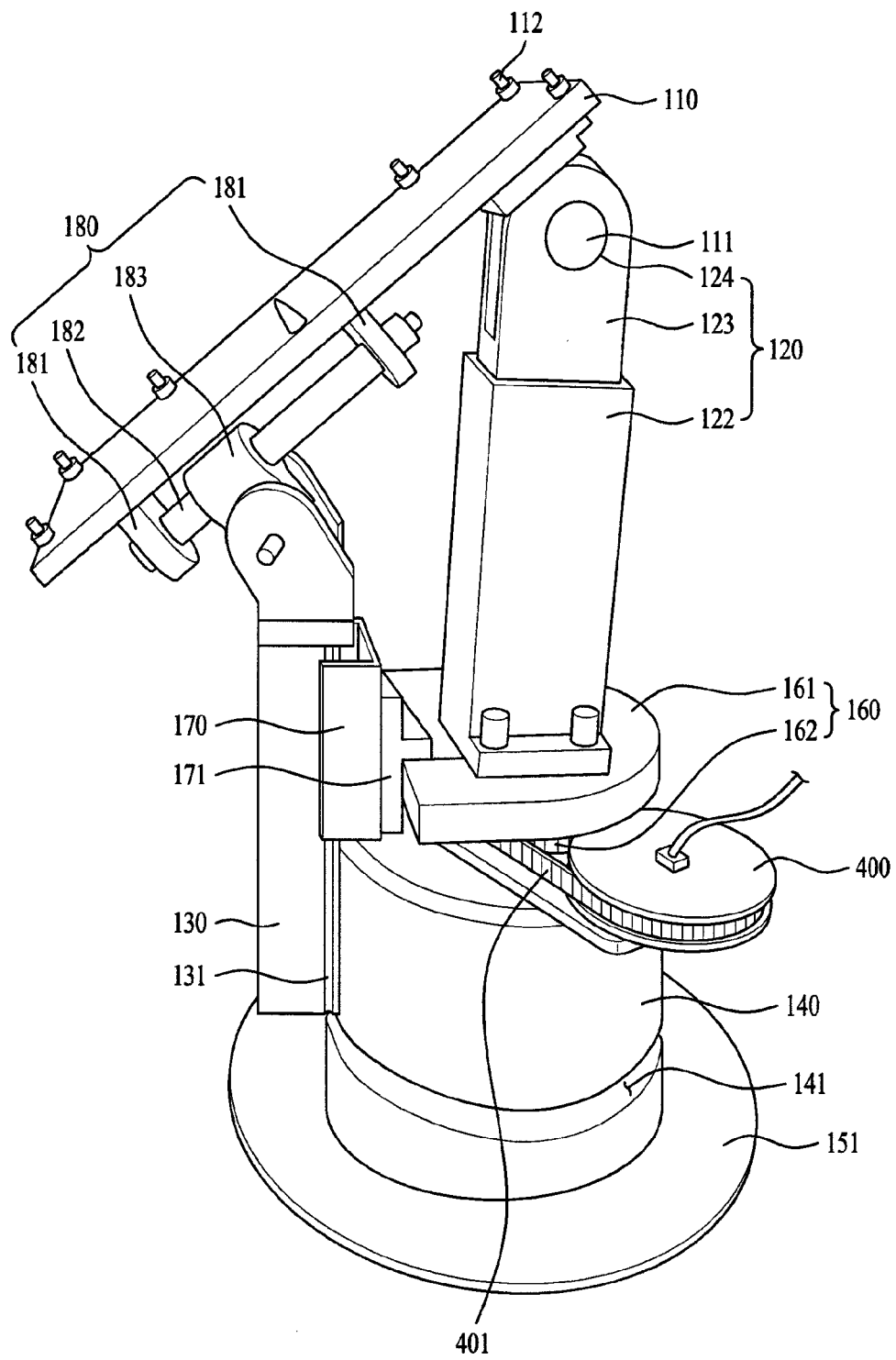
FIG. 3 is a partial perspective view of the solar cell module support assembly in accordance with the present invention.

As shown in FIG. 3, the casing 140 has a cylindrical body, and a connection plate 151 connected to the supporter 150 (with reference to FIG. 1) is provided at the lower end of the casing 140.

The cam groove 141 is provided on the outer circumferential surface of the casing 140.

The support unit 120 is rotatably provided on the upper portion of the casing 140, and the lift arm 130 is provided at the outer circumferential portion of the casing 140.

A base unit 160 supporting the support unit 120 is provided between the upper portion of the casing 140 and the support unit 120.

The base unit 160 includes a base plate 161 connected to the lower portion of the support unit 120, and a rotation gear 162 (with reference to FIG. 5) provided on the lower portion of the base plate 161.

A sensor unit 400 to measure a rotating angle of the support unit 120 and the base unit 160 is provided at one side of the base unit 160. The sensor unit 400 includes a gear unit, and the gear unit is connected to the rotation gear 162 by a power transmission member 401, such as a belt or a chain.

Therefore, if the base unit 160 and the support unit 120 are rotated, rotation of the base unit 160 and the support unit 120 is transmitted to the sensor unit 400 by the power transmission member 401, such as the belt or the chain.

Further, the sensor unit 400 measures the current rotating angle of the support unit 120 and the base unit 160, thereby detecting the current disposition direction of the solar cell module 10 (with reference to FIG. 1).

The support unit 120 includes a support rod 122 vertically disposed on the upper surface of the base plate 161, and a support bracket 123 provided on the support rod 122 such that a rotary shaft 111 provided on the rear surface of the support plate 110 is rotatably inserted into the support bracket 123.

Here, the support bracket 123 is provided in a 'ㄴ___」' shape, and is provided with insertion holes 124, into which the rotary shaft 111 is inserted, at both side walls of the support bracket 123.

Preferably, the lift arm 130 is disposed on the outer circumferential surface of the casing 140, the lower end of the lift arm 130 is disposed in the cam groove 141, and a roller or a ball to execute motion of the lift arm 130 relative to the cam groove 141 are disposed at the lower end of the lift arm 130.

The lift arm 130 is supported by a guide rail 170 so as to slidably move, and the guide rail 170 is connected to the base plate 161 by a connection block 171.

Therefore, if the support unit 120 and the base plate 161 are rotated, the guide rail 170 is also rotated, and thus the lift arm 130 may be rotated.

In order to effectively execute the sliding motion of the guide rail 170 and the lift arm 130 relative to each other, a vertical guide groove 131 is provided on the surface of the lift arm 130.

The upper end of the lift arm 130 and the rear surface of the support plate 110 are rotatably connected to each other by a connection device 180.

The connection device 180 includes shaft supporters 181 separated from each other on the rear surface of the support plate 110, a guide shaft 182 disposed between the shaft supporters 181 so as to be inclined, and a moving member 183 provided on the guide shaft 182 so as to be slidably movable.

The moving member 183 is rotatably provided at the upper end of the lift arm 130.

Therefore, if the lift arm 130 moves upwards or downwards, the moving member 183 connected to the lift arm 130 may be rotated relative to the upper end of the lift arm 130 and slide along the guide shaft 182, simultaneously.

The support plate 110 is arranged so as to be inclined, the rear portion of the rear surface of the support plate 110 is connected to the upper end of the support unit 120 by the rotary shaft 111, and the front portion of the rear surface of the support plate 110 is connected to the lift arm 130 by the connection device 180.

In the above disposition state, when the support unit 120 and the lift arm 130 are rotated, the lift arm 130 moves upwards or downwards due to the motion of the cam groove 141 and the lift arm 130 relative to each other. Then, the height of the lift arm 130 and the height of the support unit 120 are changed, and thus the disposition angle of the support plate 110 is changed.

Here, the support unit 120, the lift arm 130 and the support plate 110 constitute a motion conversion unit.

That is, the support unit 120 is connected to a rotary shaft 360 (with reference to FIG. 6) provided in rotating housings 310 and 320 (with reference to FIG. 6) and is rotatable according to rotation of the rotating housings 310 and 320, and the height of the support unit 120 is regularly maintained.

On the other hand, the lift arm 130 is connected to the support unit 120 and the lower end of the lift arm 130 is inserted into the cam groove 141 such that the height of the lift arm 130 is vertically adjustable according to rotation of the support unit 120.

The support plate 110 is disposed at the upper end of the support unit 120 and the upper end of the lift arm 130, the disposition angle and disposition direction of the support plate 110 are changed according to change of differences of the heights and directions of the support unit 120 and the lift arm 130 relative to each other generated during operation of the drive motor 101, and the frame 20 supporting the solar cell module 10 is seated on the upper surface of the support plate 110.

Figure 4:
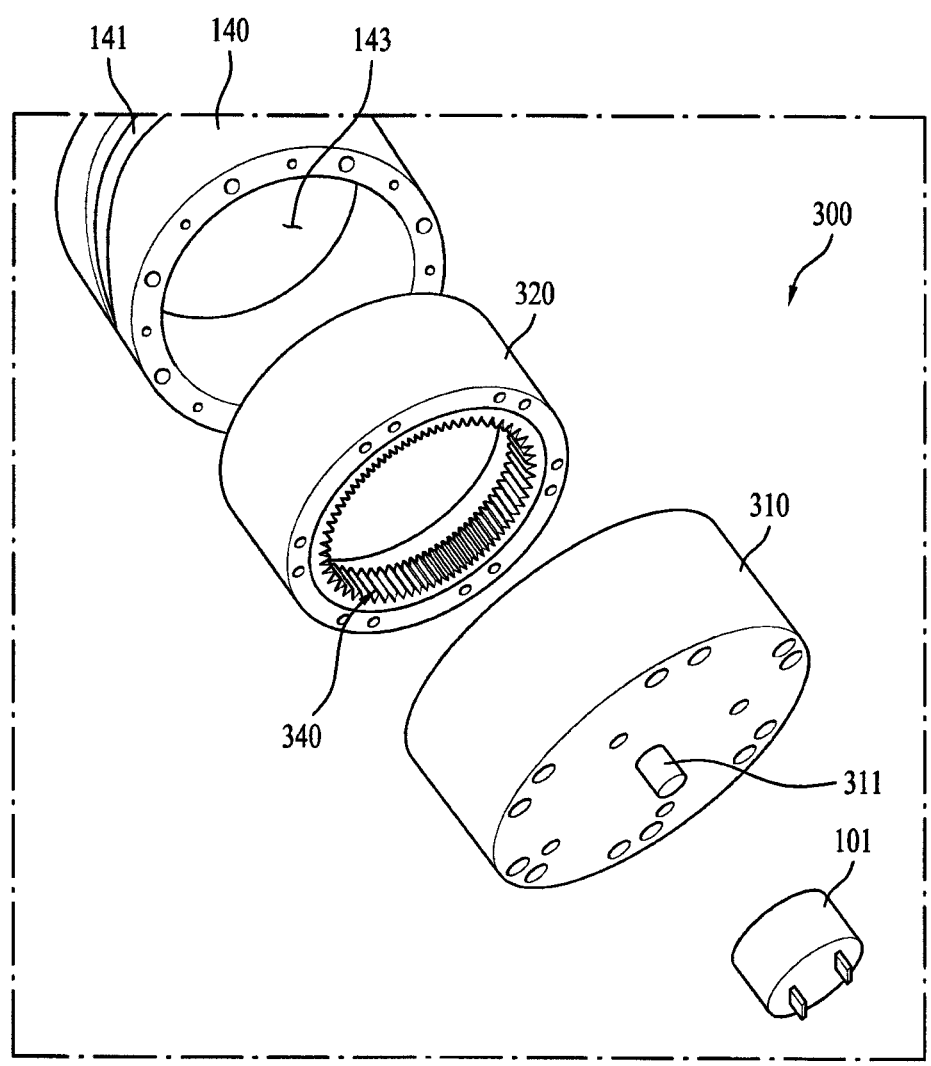
FIGS. 4 to 6 are exploded perspective views of a power transmission unit of the solar cell module support assembly in accordance with the present invention.

FIG. 4 illustrates the casing 140 provided with the cam groove 141 and the power transmission unit 300 inserted into the casing 140.

A space part 143 into which the power transmission unit 300 is rotatably inserted is provided in the casing 140.

The power transmission unit 300 includes a first rotating housing 310 and a second rotating housing 320 connected to the first rotating housing 320 and rotated together with the first rotating housing 310.

A driving shaft 311 protruding to the outside is provided on the lower surface of the first rotating housing 310. The driving shaft 311 is connected to the drive motor 101.

A driving gear 330 (with reference to FIG. 4) connected to the driving shaft 311 is provided within the first rotating housing 310.

Driven gears 340 engaged with the driving gear 330 are provided within the first rotating housing 310 and the second rotating housing 320.

One of the driven gears 340 is provided on the inner circumferential surface of the second rotating housing 320 shown in FIG. 4.

Figure 5:
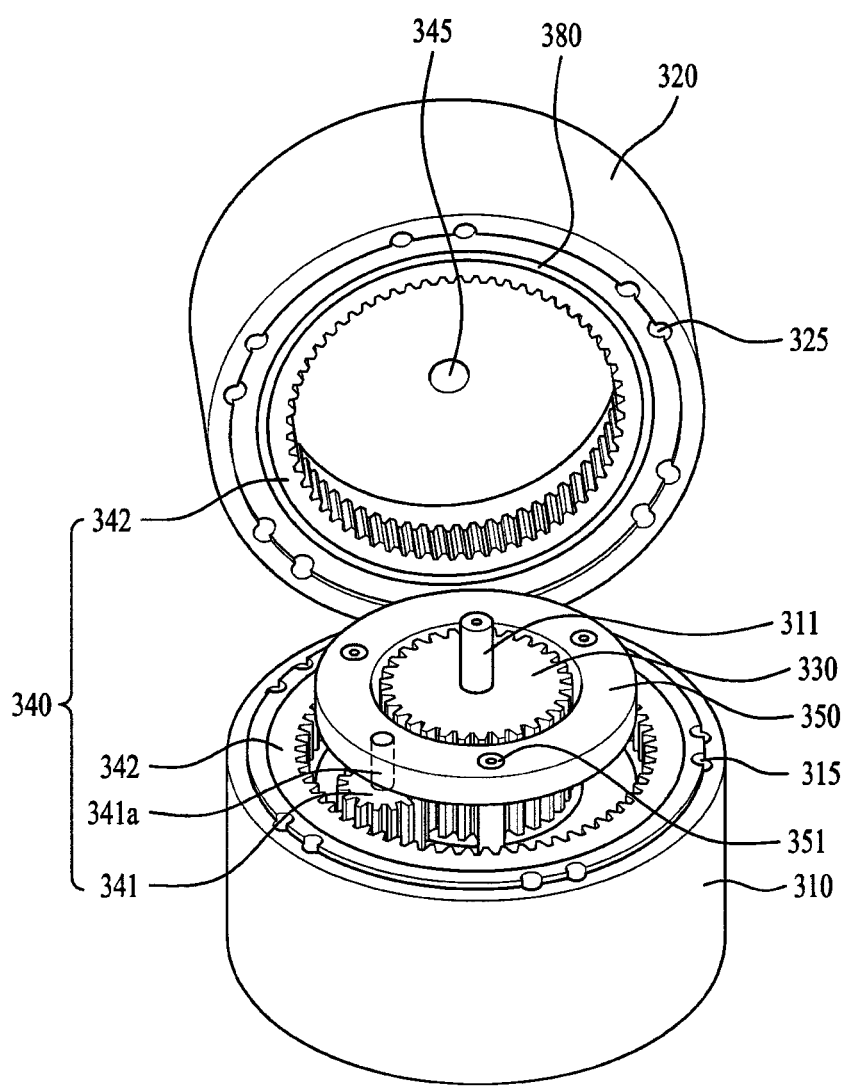

As shown in FIG. 5, the driving gear 330 is connected to the driving shaft 311.

A disc-shaped member 350 is provided in the radial direction of the driving gear 330, and a space in which the driving gear 330 is rotatable is formed within the disc-shaped member 350.

The lower surface of the disc-shaped member 350 is separated from the inner bottom of the first rotating housing 310, and is connected to the inner bottom of the first rotating housing 310 by support pints 351 separated from each other.

Further, a first driven gear 341 is rotatably connected to the disc-shaped member 350. The disc-shaped member 350 and the first driven gear 341 are connected by a fixing shaft 341a passing through the disc-shaped member 350 and the center of the first driven gear 341.

The fixing shaft 341a traverses the disc-shaped member 350, the first driven gear 341 and the inner bottom of the first rotating housing 310.

The first driven gear 341 is rotatably supported between the lower surface of the disc-shaped member 350 and the inner bottom of the first rotating housing 310.

A disc-shaped second driven gear 342 is provided on the inner circumferential surface of the first rotating housing 310, and is engaged with the first driven gear 341.

The first driven gear 341 is provided between the driving gear 330 and the second driven gear 342 and transmits rotating motion of the driving gear 330 to the second driven gear 342, thereby causing rotating motion of the second driven gear 342.

Since the second driven gear 342 is fixed to the inner circumferential surface of the first rotating housing 310, rotation of the second driven gear 342 causes rotating motion of the first rotating housing 310.

Further, another second driven gear 342 is also provided on the inner circumferential surface of the second rotating housing 320. Preferably, the second driven gear 342 provided on the inner circumferential surface of the second rotating housing 320 is also engaged with the first driven gear 342.

Here, the second driven gear 342 of the first rotating housing 310 and the second driven gear 342 of the second rotating housing 320 have the same diameter and teethed shape, thus forming one gear structure.

A plurality of fixing holes 315 and 325 separated from each other are provided at the edges of the first rotating housing 310 and the second rotating housing 320, and fixing pins (not shown) are inserted into the fixing holes 315 and 325 to connect the first rotating housing 310 and the second rotating housing 320.

Since the second driven gears 342 are fixed to the inner circumferential surfaces of the first rotating housing 310 and the second rotating housing 320, rotating motion of the second driven gears 342 causes rotating motion of the first and second rotating housings 310 and 320.

A fixing housing 380 is provided between the second rotating housing 320 and the second driven gear 342, thus maintaining a fixed state between the second driven gear 342 and the inner circumferential surface of the second rotating housing 320.

The upper end of the driving shaft 311 is exposed to be higher than the upper surface of the driving gear 330. Preferably, the upper end of the driving shaft 311 is inserted into a central hole 345 provided at the center of the second driven gear 342 inserted into the second rotating housing 320.

Figure 6:
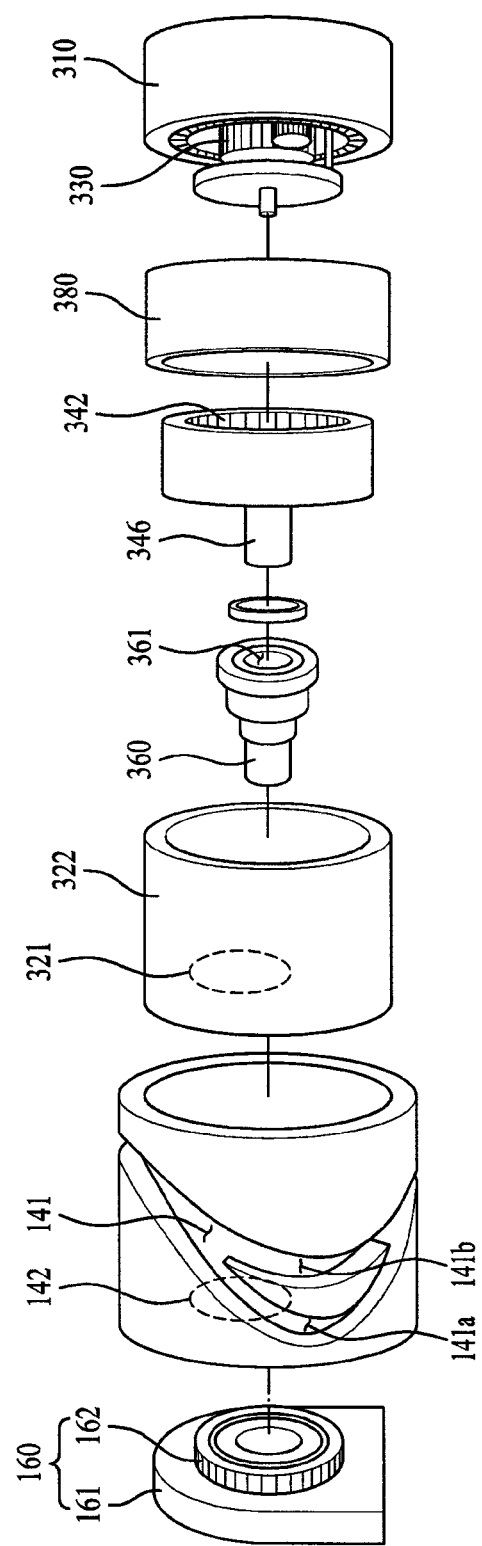

As shown in FIG. 6, the lower surface of the second rotating housing 310 is opened, and the second rotating housing 310 has a hollow structure.

The second driven gear 342 is provided in the second rotating housing 320, and an extension shaft 346 extending upwards is provided on the upper portion of the second driven gear 342.

Further, the extension shaft 346 is inserted into a connection shaft 360 connected to the base unit 160. A connection hole 361 into which the extension shaft 346 is inserted is provided on the lower portion of the connection shaft 360.

The fixing housing 380 is configured to be interposed between the outer circumferential surface of an element provided with the second driven gear 342 and the inner circumferential surface of the second rotating housing 320.

The connection shaft 360 passes through a communication hole 321 formed on the upper surface of the second rotating housing 320 and a communication hole 142 formed on the upper surface of the casing 140, and is inserted into the base unit 160, thus being fixed.

By rotatably inserting the first rotating housing 310 and the second rotating housing 320, connected to each other, into the inner space of the casing 140, the first and second rotating housings 310 and 320 may execute rotating motion within the casing 140.

The base unit 160 provided on the casing 140 is connected to the second rotating housing 320 by the connection shaft 360, and may thus execute rotating motion, together with the second rotating housing 320, relative to the casing 140.

As described above, the base unit 160 includes the base plate 161 to support the support unit 120 (with reference to FIG. 1) and the rotation gear 162 provided on the lower portion of the base plate 161 and connected to the sensor unit 400 (with reference to FIG. 3) by the power transmission member 401, such as the belt or the chain.

The connection shaft 360 is fixedly inserted into the center of the rotation gear 162.

The cam groove 141 formed in the closed loop shape is provided on the outer circumferential surface of the casing 140.

The height of the cam groove 141 is not regular, but the cam groove 151 is formed in the loop shape such that the height of the cam groove 141 may be changed. This is done in consideration of change of altitude of the sun.

The cam groove 141 includes a first groove part 141a, and a second cam groove part 141b separated from the first groove part 141 and located at a position lower than the first groove part 141. These first and second groove parts 141a and 141b are made to correspond to a difference of highest altitudes of the sun between summer and winter.

Figure 7:
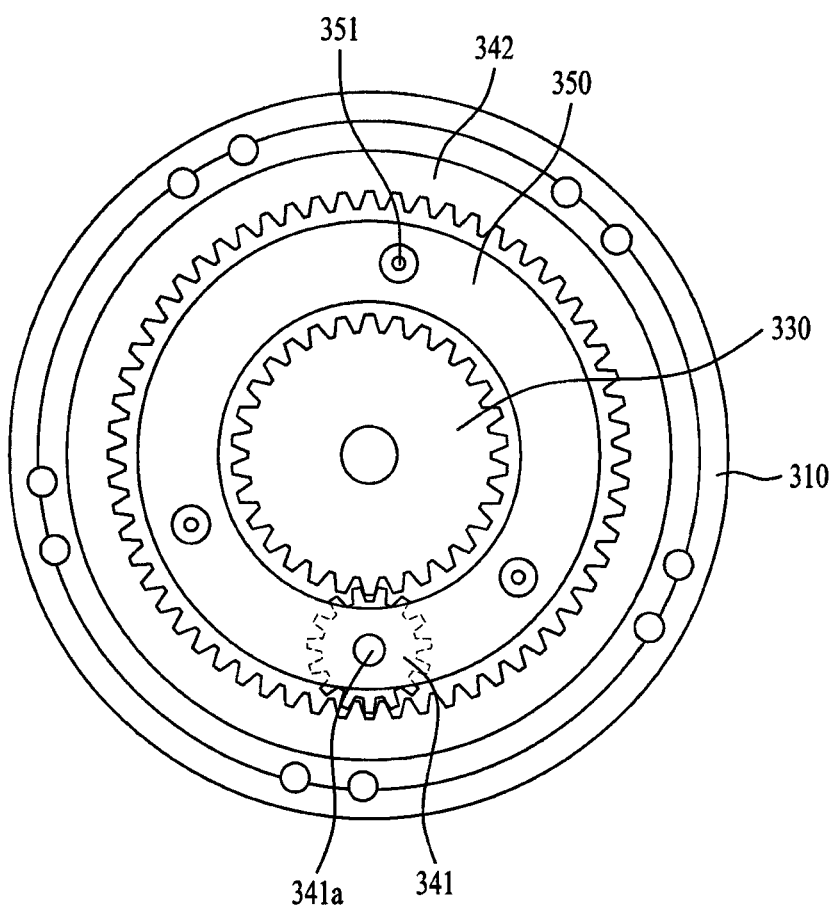
FIG. 7 is a plan view illustrating a first rotating housing and a driving gear in accordance with the present invention.

As shown in FIG. 7, the driving gear 330 and the second driven gears 342 provided within the disc-shaped member 350 are preferably provided to have a gear ratio of about 1:3-6.

Therefore, if the drive motor 101 (with reference to FIG. 4) to rotate the driving gear 330 is rotated at a high speed, the second driven gears 342 rotated by the first driven gear 341 may be rotated at a lower speed than the driving gear 330.

Since the drive motor 101 does not directly rotate the second driven gears 342 but rotates the second driven gears 342 using the driving gear 330 and the first driven gear 341, although the drive motor 101 has smaller output than output necessary to directly rotate the second driven gears 342, the drive motor 101 may rotate the second driven gears 342.

Therefore, rotating motion of the solar cell module 10 (with reference to FIG. 1) and the frame 20 (with reference to FIG. 2) may be executed even by a drive motor having a relatively small capacity.

The fixing pins 351 connecting the disc-shaped member 350 and the inner bottom of the first rotating housing 310 are separated from each other, and the fixing shaft 341a to rotatably support the first driven gear 341 is provided between one fixing pin 351 and another fixing pin 351.

Figure 8:
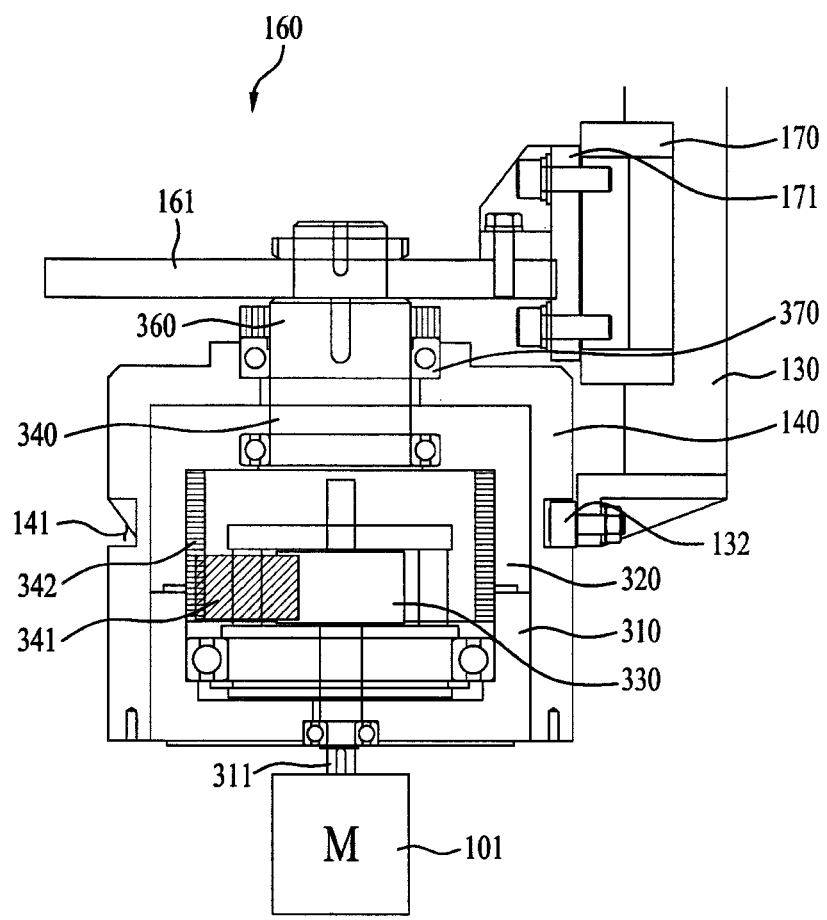
FIG. 8 is a cross-sectional view of the solar cell module support assembly in accordance with the present invention.

As shown in FIG. 8, the drive motor 101 is connected to the driving shaft 311, and the driving gear 330 is connected to the driving shaft 311.

Further, the driving gear 330 is engaged with the first driven gear 341, and the first driven gear 341 is engaged with the second driven gears 342.

The second driven gears 342 are provided on the inner circumferential surface of the first rotating housing 310 and the inner circumferential surface of the second rotating housing 320.

The extension shaft 346 extending upwards is provided on the upper portion of the second driven gear 342 provided in the second rotating housing 320 and is connected to the connection shaft 360, and the connection shaft 360 passes through the casing 140 provided with the cam groove 141 and is connected to the base unit 160.

A support bearing 370 to rotatably support the connection shaft 360 is provided between the outer circumferential surface of the connection shaft 360 and the communication hole 142 provided on the casing 140.

Further, the connection block 171 is provided on the base plate 161 of the base unit 160, and the guide rail 170 is provided on the connection block 171. The guide rail 170 supports the lift arm 130 such that the lift arm 130 is slidably movable.

The lower end of the lift arm 130 is inserted into and supported by the cam groove 141, and an element executing rolling motion, such as a roller 132, is preferably disposed at the lower end of the lift arm 130.

Figure 9:
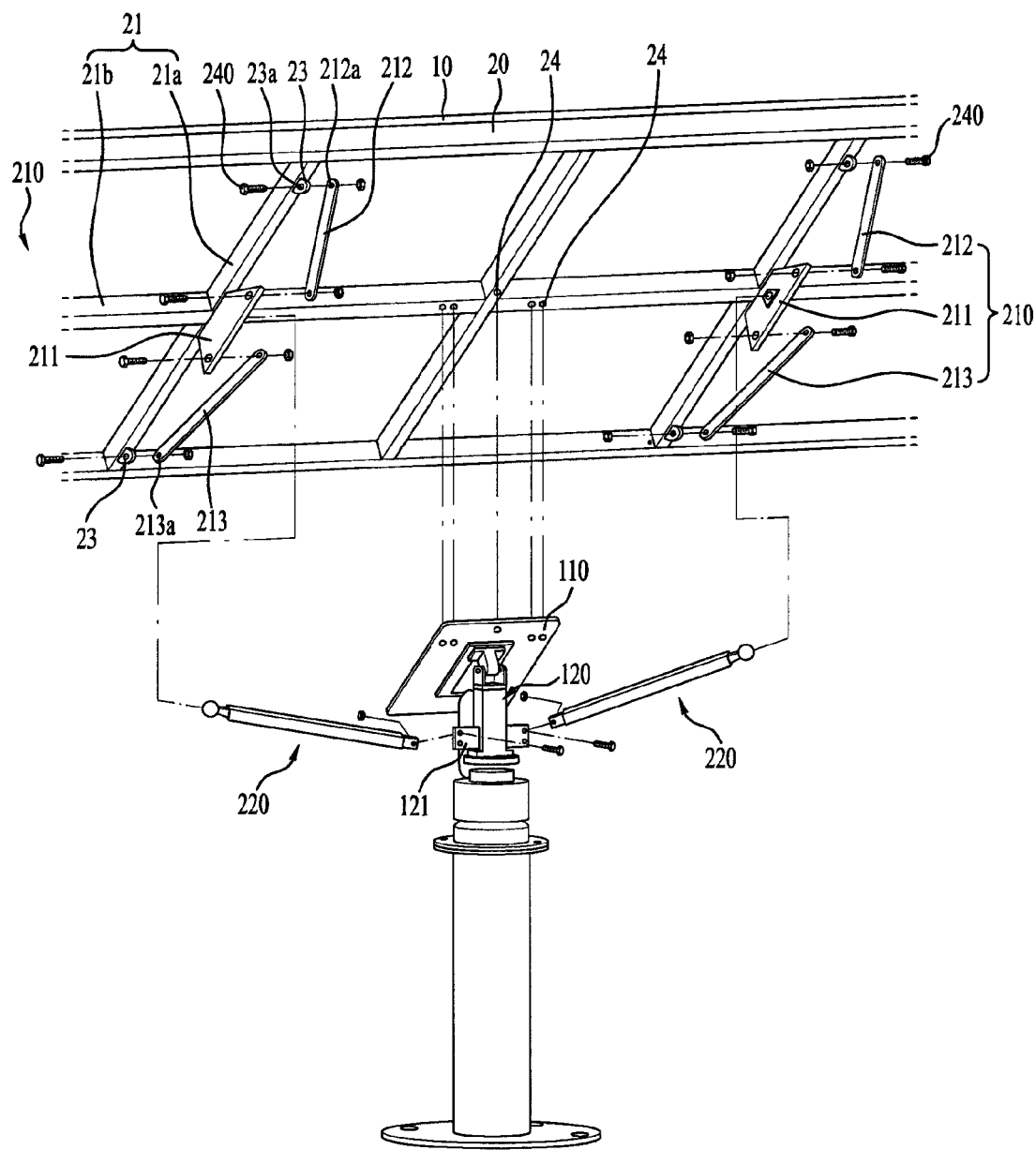
FIG. 9 is an exploded perspective view illustrating first and second connection support units in accordance with the present invention.
Figure 10:
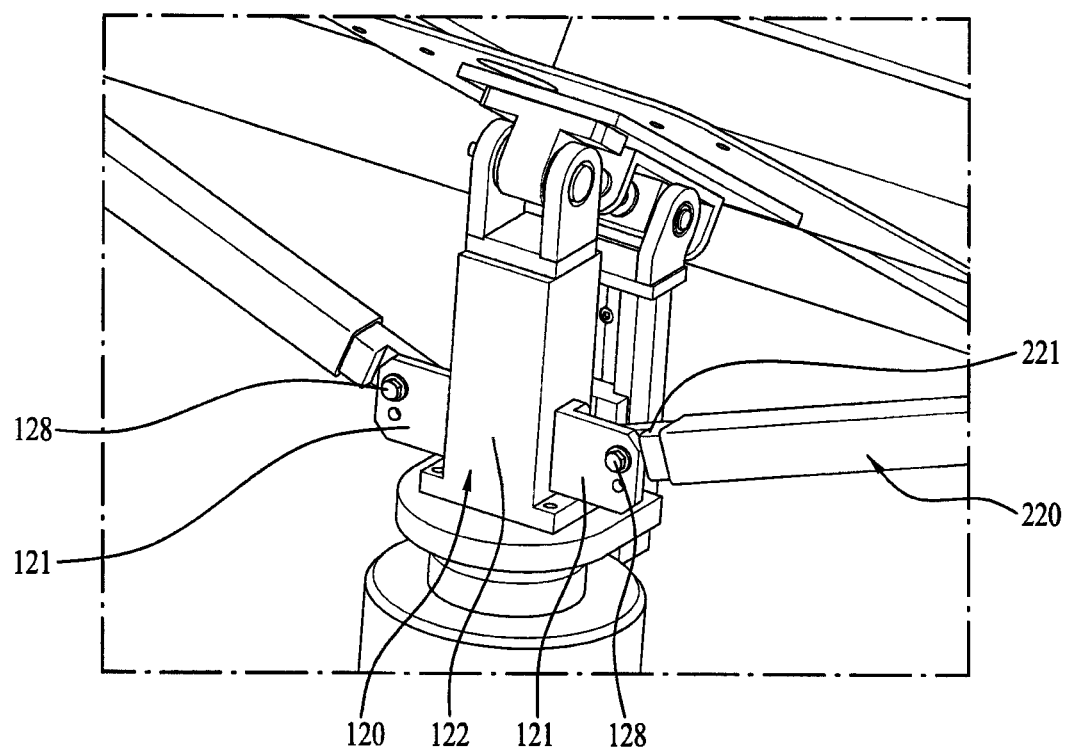
FIG. 10 is a perspective view illustrating connection between a support unit and the second connection support units in accordance with the present invention.
Figure 11:
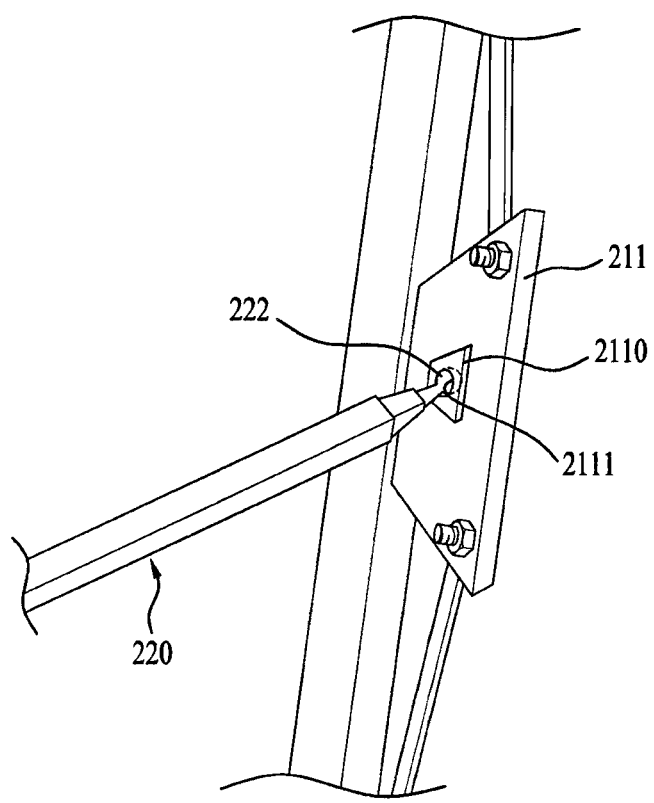
FIG. 11 is a perspective view illustrating connection between the first connection support unit and the second connection support unit in accordance with the present invention.

FIGS. 9 to 11 illustrate detailed structures of the first connection support units 210 and the second connection support units 220 in accordance with the present invention.

As shown in FIG. 9, the bracket 211 is provided at the central point of the vertical divisional wall 21a, and the upper end of the bracket 311 is connected to the upper portion of the vertical divisional wall 21a by the upper connection rod 212.

Further, the lower end of the bracket 311 is connected to the lower portion of the vertical divisional wall 21a by the lower connection rod 213.

Protrusions 23 to which the upper connection rod 212 and the lower connection rod 213 are connected are provided at the upper portion and the lower portion of the vertical divisional wall 21a, and connection holes 23a, 212a and 213a are respectively provided on the protrusions 23, the upper connection rod 212 and the lower connection rod 213.

The upper and lower connection rods 212 and 213 and the protrusions 23 are fastened by inserting fastening members 340, such as nuts and bolts, into the connection holes 23a, 231a and 213a.

Further, the second connection support units 220 are formed in a connection rod shape, and one end of each of the second connection support units 220 is connected to the bracket 211 and the other end of each of the second connection support units 220 is connected to each of the extension pieces 121 provided at both sides of the support unit 120.

Therefore, the bracket 211 may be supported by the support unit 120 through the second connection support unit 220.

Since the second connection support units 220 are connected to both sides of the support unit 120, the frame 20 may be more stably supported without leaning to the left or right.

Fixing bolts 112 (with reference to FIG. 3) separated from each other are provided on the support plate 110. The fixing bolts 112 are inserted into fastening holes 24 provided on the vertical divisional walls 21a and the horizontal divisional walls 21b of the frame 20, thus being fixed.

As shown in FIG. 10, the extension pieces 121 are provided at both sides of the support unit 120.

The extension pieces 121 are formed in a bent bracket shape and are bonded to both side surfaces of the support rod 122. However, the extension pieces 121 may be formed integrally with the support rod 122.

One end of the second connection support unit 220 is connected to the extension piece 121 by a fastening member 128, such as a bolt.

In order to maximally increase the area of a portion of one end of the second connection support unit 220 being in area contact with the extension piece 121, a stepped part 221 being in area contact with the extension piece 121 is preferably provided at the end of the second connection support unit 220.

As shown in FIG. 11, the other end of the second connection support unit 220 is connected to the bracket 211 of the first connection support unit 210.

An insertion part 2110 provided with an insertion hole 2111 into which the other end of the second connection support part 220 is inserted is provided on the bracket 211.

Preferably, a rotary joint 222 inserted into the insertion hole 2111 of the insertion part 2110 is provided at the other end of the second connection support unit 220.

Since the rotating angle of the frame 20 and the solar cell module 10 may be changed, it is necessary to rotatably connect the rotary joint 222 to the insertion hole 2111.

That is, one end of the second connection support unit 220 is fastened and fixed to the extension piece 121 of the support rod 122 (with reference to FIG. 10), and the height of the support rod 122 is not changed.

However, as the disposition angle of the lift arm 130 is changed according to movement of the lift arm 130 along the cam groove 141, the lift arm 130 executes rotating motion in the forward and backward direction and then the solar cell module 10 and the frame 20 execute rotating motion in the forward and backward direction. Thus, the brackets 211 are also moved together with the frame 20, thus executing rotating motion.

Therefore, the other end of the second connection support part 220 needs to not only be rotatably inserted into the bracket 211 to facilitate rotating motion of the bracket 211 but also be connected to the bracket 211 to maintain a connection state between the bracket 211 and the extension piece 121 (with reference to FIG. 10).

By connecting the second connection support units 220 to both sides of the support rod 122 and to the brackets 211, as described above, the frame 10 (with reference to FIG. 1) and the solar cell module 20 (with reference to FIG. 1) may be more stably supported.

Here, operation of the solar cell module support assembly 100 in accordance with the present invention will be described with reference to the accompanying drawings.

Figure 12:
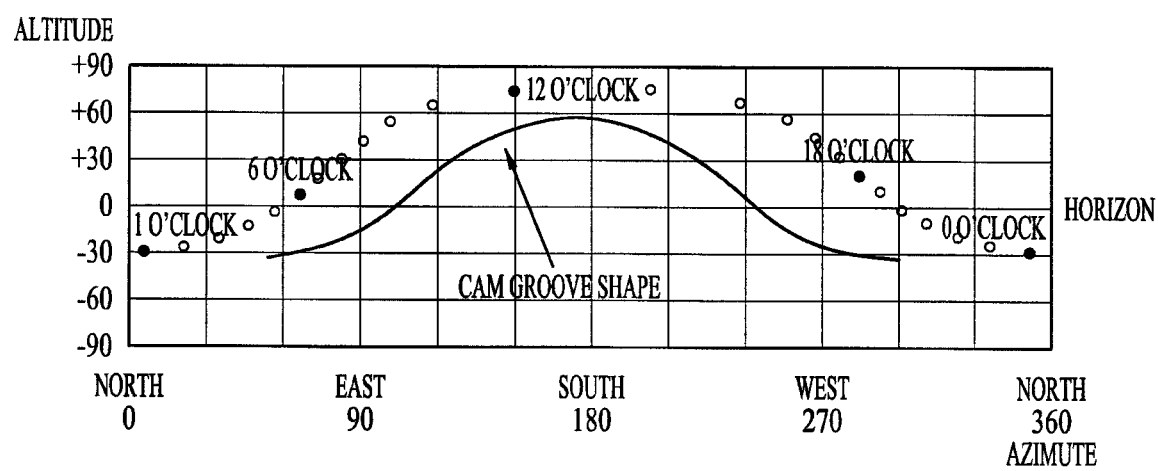
FIG. 12 is a graph illustrating change of altitude and azimuth of the sun according to time.

FIG. 12 is a graph illustrating change of altitude and azimuth of the sun according to time.

The moving trajectory of the sun during a day, i.e., from sunrise to sunset, is tracked, change of altitude and azimuth of the sun at each time zone are measured, a result of the measurement is expressed in a graph, an average value is calculated, and the cam groove 141 (with reference to FIG. 6) is formed on the casing 140 (with reference to FIG. 6) based on the calculated value.

That is, the solar cell module support assembly in accordance with the present invention functions as a kind of solar tracking apparatus, and thus may track movement of the sun from sunrise to sunset.

Preferably, the cam groove 140 is formed in a closed loop shape in consideration of change of altitude of the sun based on change of azimuth of the sun from sunrise to sunset.

When the lift arm 130 (with reference to FIG. 3) moves along the cam groove 141, the disposition angle of the solar cell module 10 is changed due to a relative height change difference between the lift arm 130 and the support unit 120, and thus the disposition direction of the solar cell module 10 is changed.

This will be described in detail, as follows.

The drive motor 101 is operated by a command from a control unit 500 to which a program command to track change of altitude and azimuth of the sun is input.

When the drive motor 101 is operated, the driving shaft 311 is rotated in a direction A, and the driving gear 330 connected to the driving shaft 311 is rotated in a direction B.

Since the first driven gear 341 is engaged with the driving gear 330, the first driven gear 341 is rotated in a direction C reverse to the rotating direction B of the driving gear 330.

Since the first driven gear 341 engaged with the driving gear 330 and the second driven gears 342 is interposed between the driving gear 330 and the second driven gears 342, rotating motion of the first driven gear 341 causes rotating motion of the second driven gears 342.

A rotating direction D of the second driven gears 342 is reverse to the rotating direction C of the first driven gear, and is the same as the rotating direction B of the driving gear 330.

Since the second driven gears 342 are fixed to the inside of the first and second rotating housings 310 and 320, the first and second rotating housings 310 and 320 are rotated in the same direction as the rotating direction D of the second driven gears 342.

Further, since the base unit 160 on which the support unit 120 (with reference to FIG. 3) is installed is connected to the second driven gears 342 by the connection shaft 360 and the extension shaft 346, the base unit 160 and the support unit 120 are rotated in the same direction as the rotating direction D of the second driven gears 342.

Since the lift arm 130 is connected to the base unit 160 by the connection block 171, the lift arm 130 is rotated in the same direction as the rotating direction D of the second driven gears 342 at the same rotating speed as that of the second driven gears 342.

Therefore, the support unit 120 and the lift arm 130 are simultaneously rotated, and thus the support plate 110 (with reference to FIG. 1), the frame 20 (with reference to FIG. 1) and the solar cell module 10 (with reference to FIG. 1) supported by the support unit 120 and the lift arm 130 are also rotated.

On the other hand, since the casing 140 provided with the cam groove 141 is not rotated but is fixed, the lift arm 130 engaged with the cam groove 141 moves along the cam groove 141.

Since the cam grove 141 is formed in the closed loop shape, the height of which is changed, when the lift arm 130 moves along the cam groove 141, the height of the lift arm 141 is changed.

Such change of the height of the lift arm 130 causes change of the disposition angle of the solar cell module 10.

Figure 14:
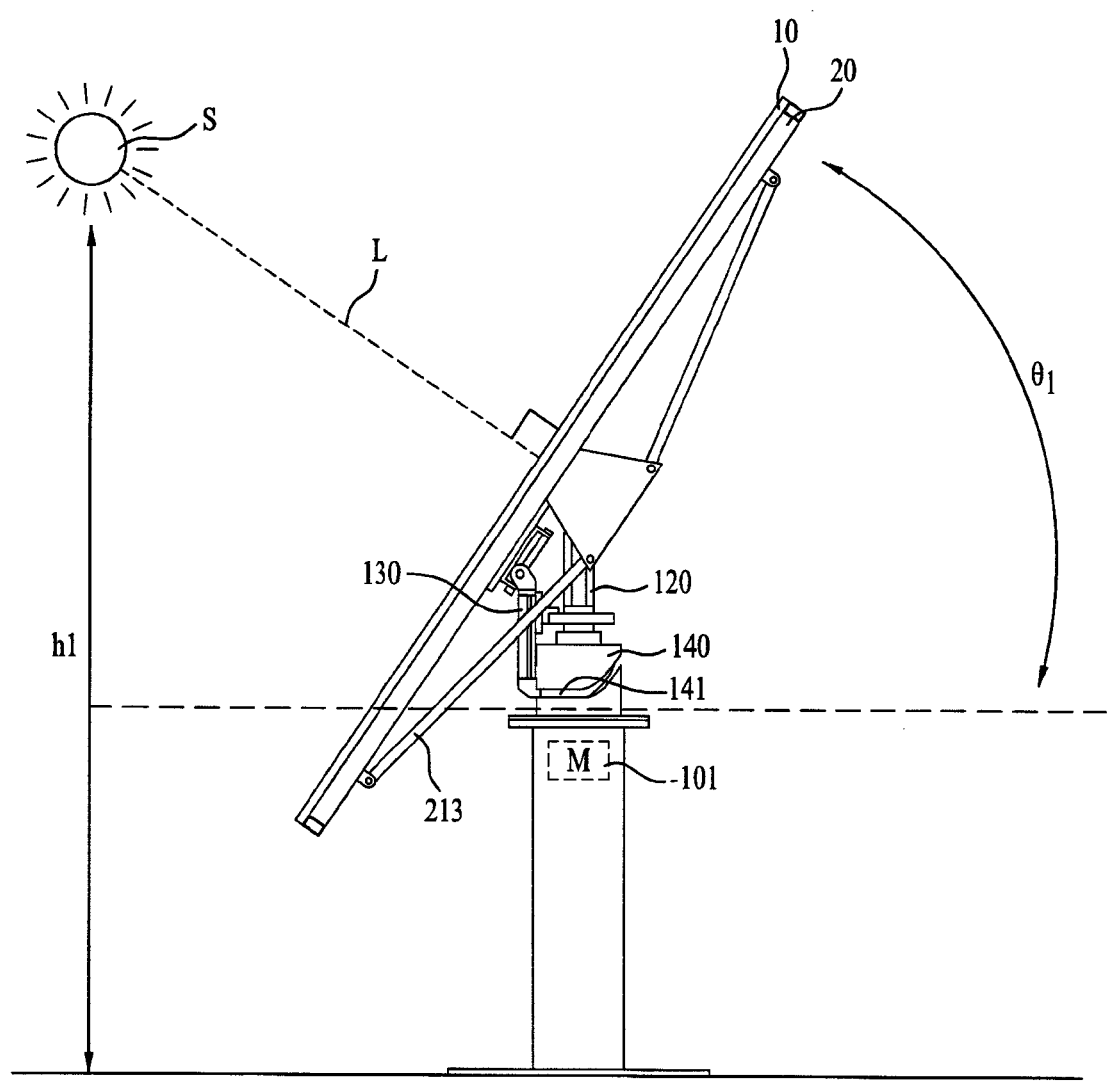
FIGS. 14 to 16 are side views illustrating change of a disposition angle of the solar cell module based on operation of the solar cell module support assembly according to time.
Figure 15:
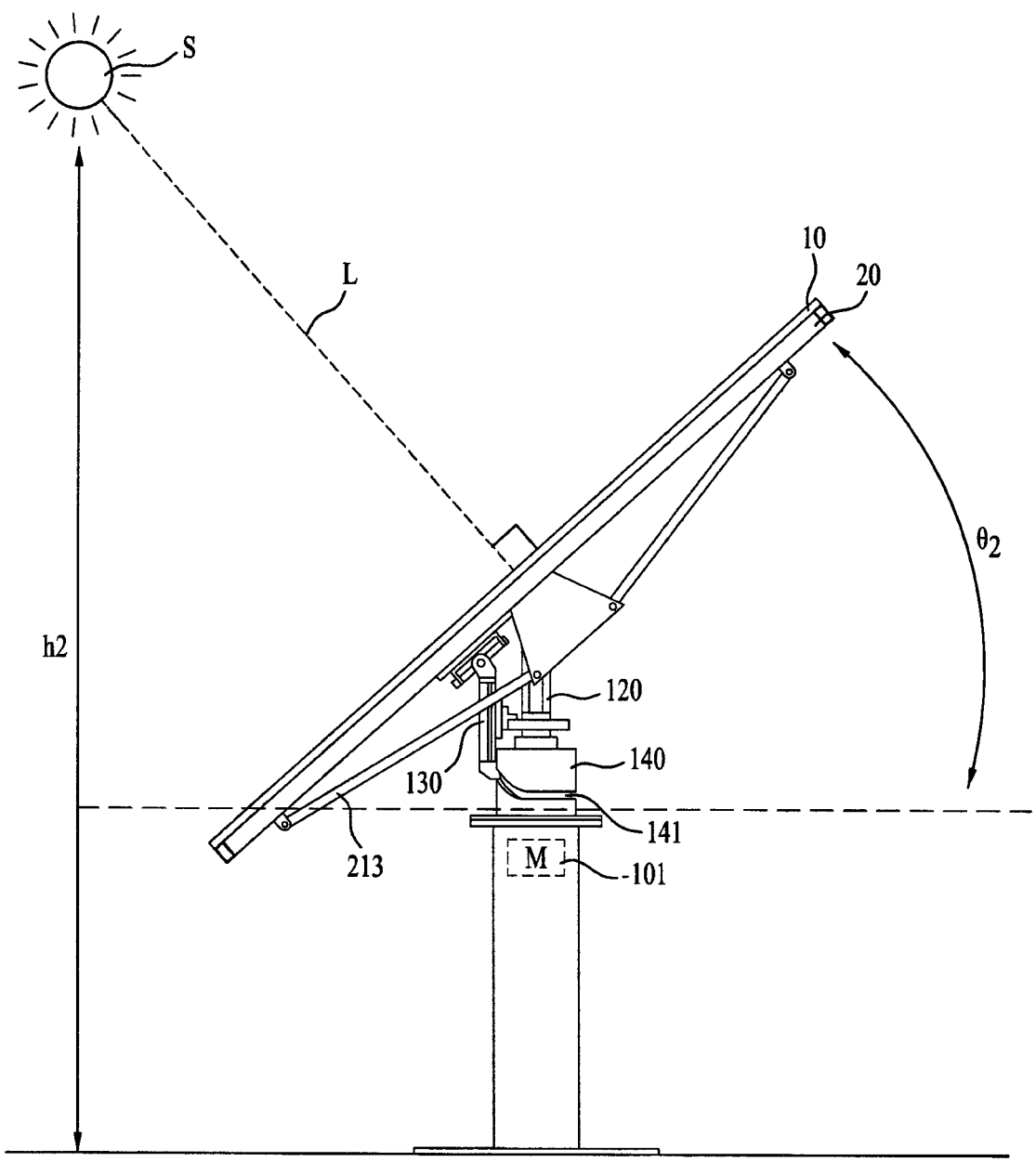
Figure 16:
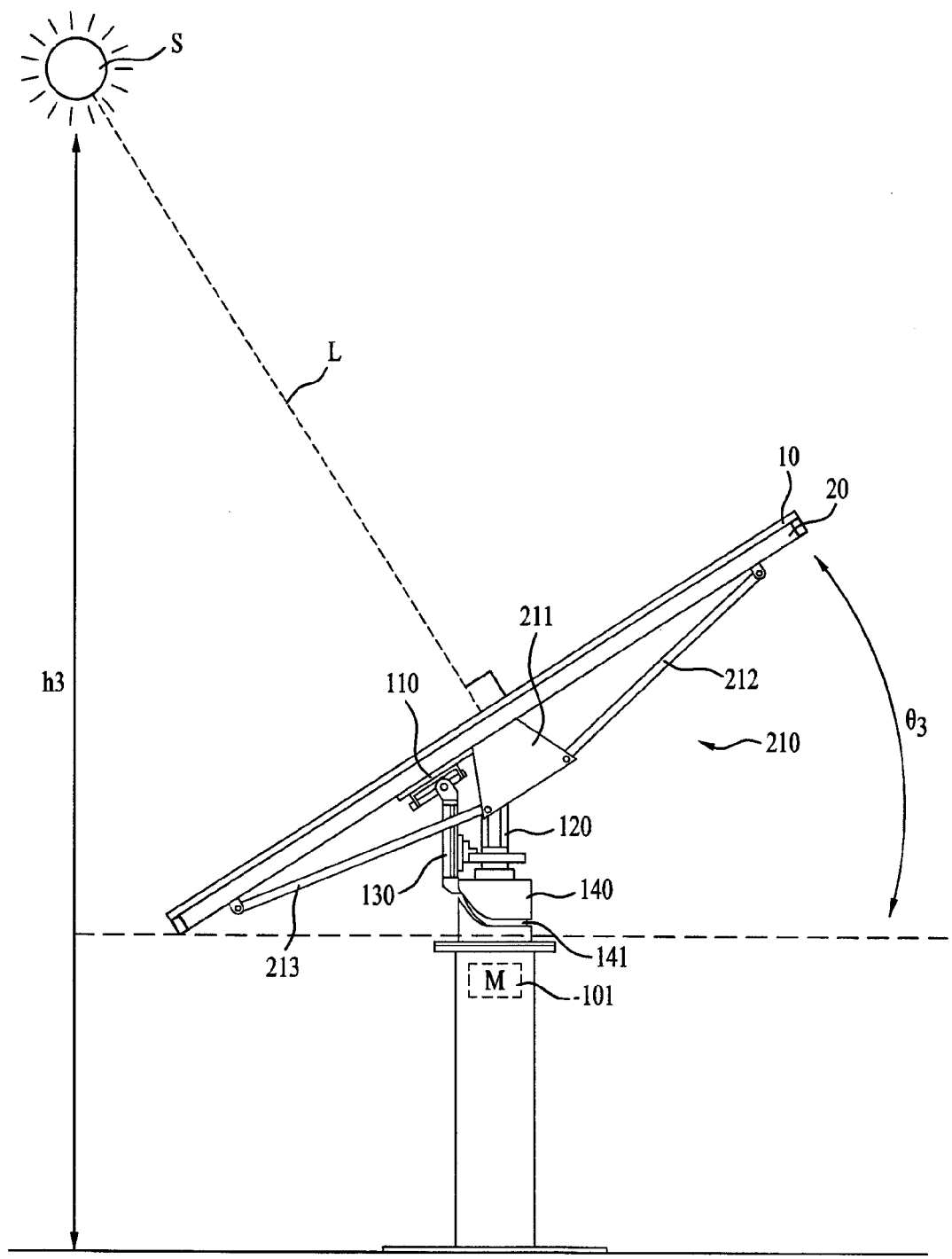

FIGS. 14 to 16 are side views illustrating change of the disposition angle of the solar cell module 10 according to change of altitude of the sun.

If the surface of the solar cell module 10 is perpendicular to a straight line from the sun S to the solar cell module 10, light collection efficiency may be maximized.

An altitude h1 of the sun is lowest at sunrise. In this case, a disposition angle θ1 of the solar cell module 10 must be largest.

For this purpose, the lower end of the lift arm 130 must be located at the lowest position of the cam groove 141.

In this case, a height difference between the upper end of the lift arm 130 and the upper end of the support unit 120 is largest, and thus the disposition angle of the solar cell module 10 is largest.

At this time, the solar cell module 10 must face the east.

As shown in FIG. 15, as time goes by, the sun moves from the east to the southeast, and thus the sun reaches a higher altitude h2.

Figure 13:
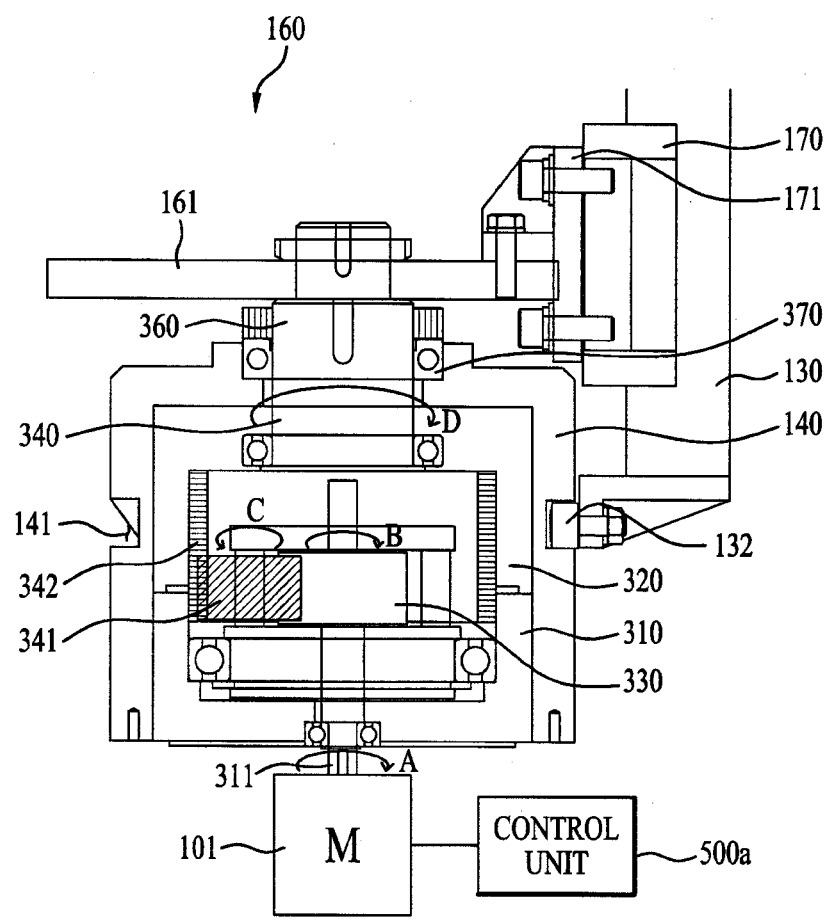
FIG. 13 is a view illustrating operation of the solar cell module support assembly in accordance with the present invention.

When the control unit 500 (with reference to FIG. 13) controls the drive motor 101 based on the above change of the direction and altitude of the sun, the solar cell module 10 faces the southeast due to rotation of the drive motor 101.

In this case, the height of a position of the cam groove 141 with which the lower end of the lift arm 130 is engaged is higher than the height of FIG. 14, and thereby, the lift arm 130 move upwards.

When a height difference between the upper end of the lift arm 130 and the upper end of the support unit 120 is smaller than the height difference of FIG. 14, the solar cell module 10 is bent back and thus a disposition angle θ2 of the solar cell module 10 is smaller than the disposition angle θ1 of FIG. 14.

As shown in FIG. 16, as time further goes by, when the sun reaches the highest altitude h3, the sun is located to the south.

The solar cell module 10 is rotated to face the south, and the lower end of the lift arm 130 is located at a position of the cam groove 141 which has the highest height.

The lift arm 130 moves upwards to a position higher than FIG. 15, and a height difference between the upper end of the lift arm 130 and the upper end of the support unit 120 is further reduced as much.

Therefore, a disposition angle θ3 of the solar cell module 10 is the smallest, and thus light collection efficiency may be maximized.

Thereafter, as time further goes by, the sun moves to the southwest and the altitude of the sun is lowered. Correspondingly, the solar cell module support assembly 100 executes rotating motion so as to allow the solar cell module 10 to face the southwest.

Further, based on the lowered altitude, the height of a position of the cam groove 141 with which the lower end of the lift arm 13 is engaged is lower than the height of FIG. 15, and the disposition angle of the solar cell module 10 is larger than the disposition angle of FIG. 15.

As sunset approaches, the sun is located to the west and the altitude of the sun is further lowered.

Correspondingly, the solar cell module support assembly 100 executes rotating motion so as to allow the solar cell module 10 to face the west.

Further, based on the altitude of the sun, the height of a position of the cam groove 141 with which the lower end of the lift arm 13 is engaged becomes lowest.

Therefore, the disposition angle of the solar cell module 10 becomes largest.

The solar cell module support assembly 100 rotates the solar cell module 10 after sunset, before sunrise of the next day, so as to allow the solar cell module 10 to collect light at sunrise of the next day.

Therefore, the light collection efficiency of the solar cell module 10 may be maximized based on change of altitude of the sun and change of a disposition direction of the solar cell module 10 according to lapse of time.

It will be apparent to those skilled in the art that various modifications and change can be made in the present invention without departing from the spirit or scope of the invention. Thus, it is intended that the present invention covers the modifications and change of this invention provided they come within the scope of the appended claims and their equivalents.

The invention claimed is:

1. A solar cell module support assembly comprising:
   a solar cell module and a frame supporting the solar cell module;
   a drive motor changing a disposition angle and disposition direction of the frame;
   a power transmission unit transmitting power of the drive motor to the frame and supporting the frame,
   wherein the power transmission unit comprises:
      a driving gear connected to the drive motor and rotated by the drive motor;
      driven gears provided to be engaged with the driving gear and rotated according to rotation of the driving gear;
      rotating housings accommodating the driven gears and rotated according to rotation of the driven gears; and
      a casing accommodating the rotating housings and provided with a cam groove formed on an outer circumferential surface thereof;
   a motion conversion unit to convert rotating motion of the power transmission unit into rotating motion and vertical motion of the frame;
   first connection support units connecting upper and lower portions of a rear surface of the frame;
   second connection support units connecting the first connection support units to the motion conversion unit;
   a driving shaft connected to the drive motor, the driving gear being connected to the driving shaft; and
   a disc-shaped member disposed around the driving gear and forming a rotation space in which the driving gear is rotated therein,
   wherein the driven gears comprise:
      a first driven gear rotatably supported by the disc-shaped member and provided to be engaged with the driving gear; and
      second driven gears provided on inner circumferential surfaces of the rotating housings and engaged with the first driven gear.

2. The solar cell module support assembly according to claim 1, wherein the motion conversion unit includes:
   a support unit connected to a connection shaft provided on the rotating housings, rotated according to rotation of the rotating housings, and having a uniformly maintained height;
   a lift arm connected to the support unit and provided with a lower end inserted into the cam groove such that the height of the lift arm is vertically adjustable according to rotation of the support unit; and
   a support plate disposed at the upper end of the support unit and the upper end of the lift arm such that a disposition angle and disposition direction of the support plate are changed according to a change of a relative height difference between the support unit and the lift arm and a change of a disposition direction of the support unit and the lift arm during operation of the drive motor and the frame supporting the solar cell module is seated on an upper surface of the support plate.

3. The solar cell module support assembly according to claim 2, wherein each of the first connection support units includes:
   a bracket disposed on the rear surface of the frame such that the brackets of the first connection support units are disposed at both sides of the rear surface of the frame so as to be separated from each other;

an upper connection rod connecting the bracket to the upper portion of the rear surface of the frame; and a lower connection rod connecting the bracket to the lower portion of the rear surface of the frame.

4. The solar cell module support assembly according to claim 3, wherein one end of each of the second connection support units is rotatably connected to the bracket through a rotary joint provided thereon, and the other end of each of the second connection support units is connected to each of extension pieces provided on a side surface of the support unit.

5. The solar cell module support assembly according to claim 1, wherein the rotating housings comprise:

a lower rotating housing provided on the drive motor and accommodating the driving gear and the disc-shaped member; and an upper rotating housing connected to the lower rotating housing.

6. The solar cell module support assembly according to claim 5, wherein one second driven gear is accommodated in the upper rotating housing, further comprising a fixing housing inserted and fixed between the outer circumferential surface of the second driven gear and the inner circumferential surface of the upper rotating housing.

7. The solar cell module support assembly according to claim 5, further comprising an extension shaft provided on the upper surface of one second driven gear and extending upwards to pass through the upper surface of the upper rotating housing, wherein:

the extension shaft is provided to be inserted into the connection shaft; and a base unit provided under the support unit is connected to the upper portion of the connection shaft.

8. The solar cell module support assembly according to claim 7, wherein:

the base unit includes a base plate, and a rotation gear provided under the base plate; and the rotation gear is connected to a sensor unit to sense a rotating angle by a chain or a belt.

* * * * *